United States Patent [19]
Miller et al.

[11] Patent Number: 5,818,859
[45] Date of Patent: Oct. 6, 1998

[54] BE-CONTAINING II-VI BLUE-GREEN LASER DIODES

[75] Inventors: Thomas J. Miller, Minneapolis; Michael A. Haase, Woodbury; Paul F. Baude, Minneapolis, all of Minn.; Michael D. Pashley, Peekskill, N.Y.

[73] Assignee: Minnesota Mining and Manufacturing Company, St. Paul, Minn.

[21] Appl. No.: 726,618

[22] Filed: Oct. 7, 1996

Related U.S. Application Data

[60] Provisional application No. 60/020,893 Jun. 27, 1996.

[51] Int. Cl.[6] ....................................................... H01S 3/19
[52] U.S. Cl. ............................................... 372/45; 372/46
[58] Field of Search ............................ 372/45, 46, 43–44

[56] References Cited

U.S. PATENT DOCUMENTS

| | | | |
|---|---|---|---|
| 5,327,445 | 7/1994 | Matsumoto et al. | 372/45 |
| 5,373,521 | 12/1994 | Takahashi | 372/45 |
| 5,375,134 | 12/1994 | Okuyama et al. | 372/45 |
| 5,404,027 | 4/1995 | Haase et al. | 372/45 |
| 5,406,574 | 4/1995 | Rennie et al. | 372/45 |
| 5,422,902 | 6/1995 | Mensz | 372/45 |
| 5,513,199 | 4/1996 | Haase et al. | 372/44 |

FOREIGN PATENT DOCUMENTS

| | | |
|---|---|---|
| 0556461A | 8/1993 | European Pat. Off. . |
| 7-66494 | 3/1995 | Japan . |
| 7-232999A | 9/1995 | Japan . |
| 8-070155A | 3/1996 | Japan . |
| 8-097518A | 4/1996 | Japan . |
| 8-148765A | 6/1996 | Japan . |
| WO 97/18592 | 5/1997 | WIPO . |

OTHER PUBLICATIONS

Itoh, S., et al., "Room Temperature Pulsed Operation of 498–NM Lasers", (Aug. 29, 1993), *International Conference on Solid State Devices and Materials*, pp. 53–55.

"Alternative Materials for II–VI Light Emitting Diodes and Lasers", by G. Landwehr and A. Waag, Mar. 5–7, 1996.

"Design of Ohmic Contacts to p–ZnSe", by R.G. Dandrea and C.B. Duke, *Appl. Phys. Lett.*, 18 Apr. 1994, pp. 2145–2147.

"BeTe/ZnSe Graded Band Gap Ohmic Contacts to p–ZnSe", by P.M. Mensz, *Appl. Phys. Lett.*, 18 Apr. 1994, pp. 2148–2150.

"Electrical Properties of Light Emitting Devices Based on the II–VI Compounds BeTe and BeMgZnSe", by F. Fischer, J. Laubender, H. Lugauer, T. Litz, A. Weingärtner, U. Zehnder, T. Gerhard, W. Ossau, K. Schüll, A. Waag and G. Landwehr, *EMRS Spring Meeting, Strasbourg, 1996, Symposium C*, pp. 1–12.

Abstract of Symposium C–IV.2 from the European Materials Research Symposium (EMRS) which took place in Strasbourg, Germany on Jun. 4, 1996.

*Primary Examiner*—Rodney B. Bovernick
*Assistant Examiner*—Luong-Quyen T. Phan
*Attorney, Agent, or Firm*—Judson K. Champlin; Lorraine R. Sherman

[57] ABSTRACT

A II–VI compound semiconductor laser diode includes a plurality of II–VI semiconductor layers forming a pn junction supported by a single crystal GaAs semiconductor substrate. The layers formed in the pn junction include a first cladding layer of a first conductivity type, a second cladding layer of a second conductivity type, and at least a first guiding layer between the first and second cladding layers. A quantum well active layer is positioned within the pn junction. Electrical energy is coupled to the laser diode by first and second electrodes. Various layers in the laser diode are formed using Be.

22 Claims, 3 Drawing Sheets

BE-CONTAINING II-VI BLUE-GREEN LASER DIODES

GOVERNMENT RIGHTS

The United States government has certain rights in this invention pursuant to Contract No. DARPA/ARO DAAH 04-94-C-0049 awarded by the Defense Advanced Research Projects Agency and the Department of the Army/Army Research Office.

BACKGROUND OF THE INVENTION

The present application claims the benefit of earlier filed U.S. provisional application Ser. No. 60/020,893, entitled BE-CONTAINING II–VI BLUE-GREEN LASER DIODES filed on Jun. 27, 1996.

The present invention relates generally to semiconductor laser diodes. More specifically., the present invention relates to a blue-green laser diode fabricated from II–VI semiconductor materials.

Traditionally, laser diodes have generated infrared and red light. However, there are many commercial applications where laser diodes which emit radiation in shorter wavelengths, for example in the green and blue portions of the spectrum (i.e., at wavelengths between 590 and 430 nm) would have wide spread application. Further, such short wavelength laser diodes would increase the performance and capabilities of many existing systems which currently use infrared and red laser diodes.

There has been an ongoing effort to create blue-green laser diodes. For example, U.S. Pat. No. 5,513,199, entitled BLUE-GREEN LASER DIODE which issued Apr. 30, 1996 to Haase et al. is one such example. This reference describes a blue-green laser which uses a II–VI separate confinement heterostructure (SCH). Typically, the laser diode is fabricated on a GaAs substrate and all layers are nominally lattice-matched to the substrate with the exception of the pseudomorphic quantum well and the p-type contact which typically contains relaxed ZnTe. In one such laser, the light output is at 515 nm and the guiding and cladding layers are nominally lattice-matched to the GaAs substrate and have bandgaps of 2.72 and 2.85 eV, respectively. The laser diode employs a quantum well and ZnTe layers which are under high compressive strain.

This particular structure appears promising and room temperature continuous wave laser lifetimes have been recorded of over 100 hours. However, it would be desirable to increase the lifetime, reliability and output of blue-green laser diodes. Beryllium (Be) has been proposed to be used with Te to form an ohmic contact as described in U.S. Pat. No. 5,422,902. Further, the growth of BeTe and BeMgZnSe alloys, and the fabrication of rudimentary blue emitting LED's have been described. However, the art has lacked a laser diode fabricated in a manner which incorporates Be to form a useful device.

SUMMARY OF THE INVENTION

The present invention is a II–VI compound separate confinement heterostructure semiconductor laser diode which includes a plurality of layers of II–VI semiconductor forming a pn junction. The layers include a first cladding layer of II–VI semiconductor of a first conductivity type which includes Be. A first guiding layer of II–VI semiconductor overlies the first cladding layer. An active layer of II–VI semiconductor overlies the first guiding layer and second guiding layer of II–VI semiconductor overlies the active layer. The active layer may comprise a quantum well active layer or a multiple quantum well active layer. A second cladding layer of II–VI semiconductor that includes Be and is of the second conductivity type and overlies the second guiding layer.

DETAILED DESCRIPTION OF THE PREFERRED EMBODIMENTS

Performance of prior art laser diodes suffers due to a number of reasons. In prior art laser diodes, it is difficult to control the composition of the ternary and quaternary layers due to the presence of sulfur (S) in the structure. Similarly, the presence of S in the growth chamber leads to stacking fault defects which normally occur at the GaAs/ZnSe interface. Further, in prior art laser diodes, p-type contact lifetime is insufficient, which may be a consequence of the relatively high (8%) lattice mismatch between ZnTe and GaAs.

One aspect of the invention includes the use of beryllium (Be) in a laser diode, which provides a number of beneficial results. More specifically, by replacing S with Be in the guide and cladding layers, a number of benefits are provided.

Figure 1:
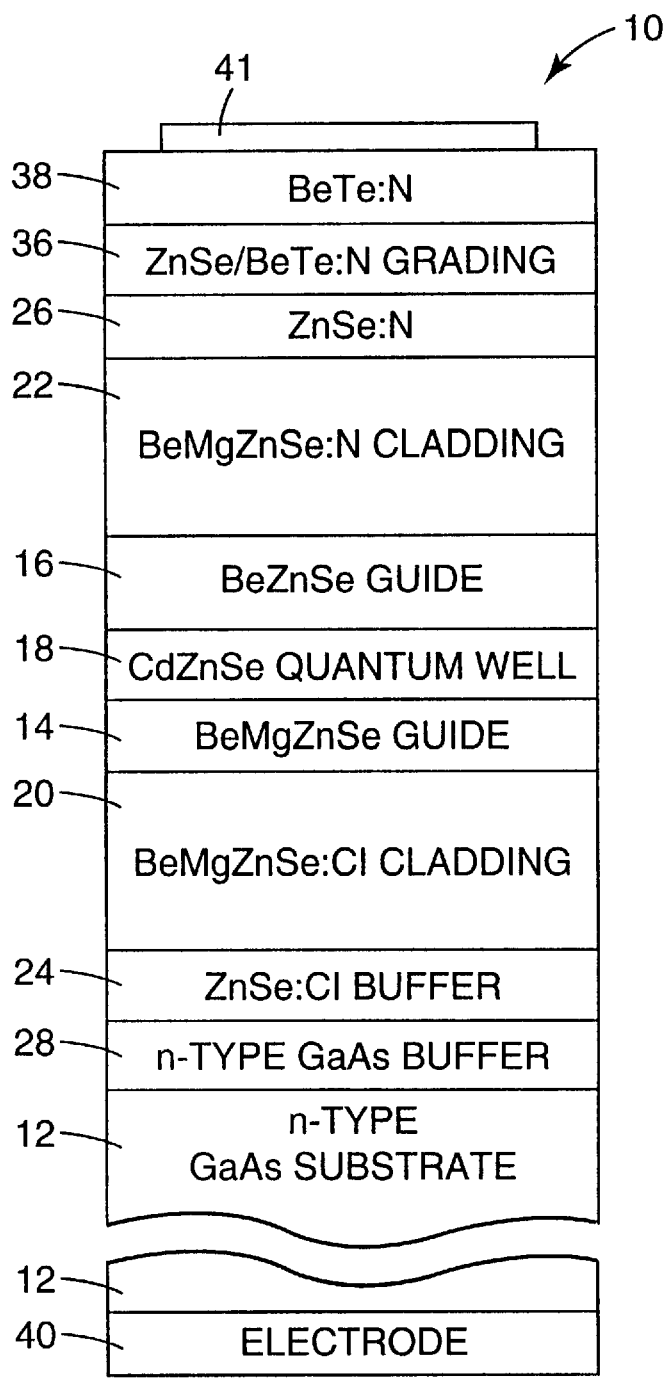
FIG. 1 is a cross-sectional view (not to scale) illustrating the structure of a II–VI semiconductor laser diode in accordance with the present invention.

Structure of a laser diode 10 in accordance with the present invention is illustrated generally in FIG. 1. Laser diode 10 is a wide bandgap II–VI device fabricated from heteroepitaxial layers grown by molecular beam epitaxy (MBE) on a GaAs substrate. Laser diode 10 is fabricated on a GaAs substrate 12 and includes lower (first) and upper (second) BeZnSe light guiding layers 14 and 16, respectively, separated by a CdZnSe quantum well active layer 18. The surfaces of light guiding layers 14 and 16 opposite active layer 18 are bounded by lower (first) and upper (second) BeMgZnSe cladding layers 20 and 22, respectively. A lower ZnSe:Cl buffer layer 24 is positioned on the surface of lower cladding layer 20 which is opposite light guiding layer 14. An upper BeTe:N/ZnSe ohmic contact 34 is positioned on the surface of upper cladding layer 22 which is opposite light guiding layer 16.

A GaAs buffer layer 28 separates substrate 12 from lower ZnSe:Cl buffer layer 24 to assure high crystalline quality of the contact and subsequently growth layers. A p-type contact 34 is formed by ZnSe:N layer 26, ZnSe/BeTe:N grading layer 36 and BeTe:N layer 38. Electrode 41 is provided for electrical contact to layer 38. Further, an electrode 40 is provided to contact GaAs substrate 12 opposite lower buffer layer 24. Layers 20 and 24 are all doped n-type with Cl (i.e., are of a first conductivity type). Further, layers 22 and 26 are doped p-type with N (i.e., are of a second conductivity type). Active layer 18 is an undoped quantum well layer of CdZnSe semiconductor.

In one aspect of the present invention, Be is used in the guide, cladding and upper contact layers. Beryllium provides a sticking coefficient which is near unity over a large substrate temperature range. The near unity sticking coefficient greatly improves composition control. Furthermore, Be-containing quaternary alloys do not segregate laterally and therefore have a relatively constant lateral composition. Additionally, Be is easily controlled in an MBE system such as that used during fabrication and is less likely to leak around shutters of the MBE system than S which is used in typical prior art designs. Thus, the use of Be reduces stacking faults in the structure. Further, BeTe has a higher stacking fault energy than the prior art ZnSe and therefore a BeTe buffer layer grown on the GaAs substrate provides lower stacking fault densities than in typical prior art designs.

Furthermore, the invention provides improved contact lifetime for the p-type contact 34. Specifically, BeTe is used in place of ZnTe in the p-type contact 34. BeTe and GaAs are mismatched by only 0.35%, such that BeTe layers 36, 38 of roughly 1000 Å will remain pseudomorphic. The p-type contact 34 is digitally graded to aid in hole injection and the ZnSe/BeTe layer 36 can be tuned for this purpose exclusively, rather than trying to simultaneously maintain the quality of the crystal. Additionally, since the lattice constant of BeTe is smaller than GaAs, this graded region of the contact 34 can be nominally grown to any desired thickness while remaining pseudomorphic.

Figure 2:
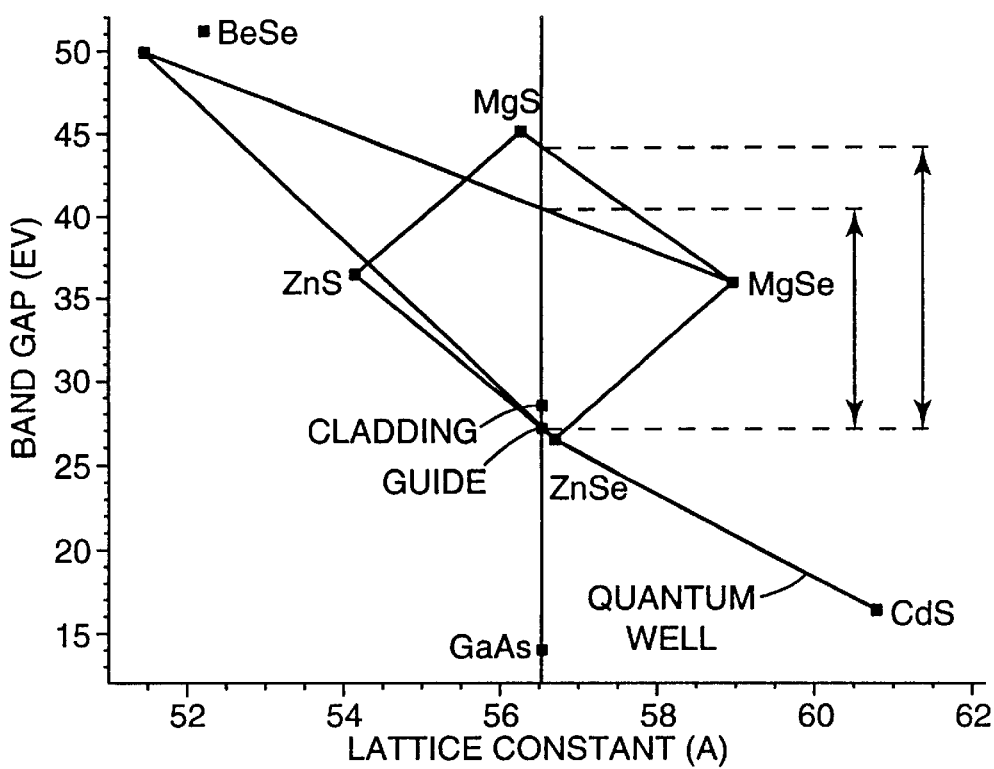
FIG. 2 is a graph of bandgap versus lattice constant for various compositions and is used to illustrate the present invention.

FIG. 2 is a graph of bandgap versus lattice constant for various materials neglecting bowing effects. FIG. 2 shows the energy gaps of the constituent compounds for the ternary guide layers and the quaternary cladding layers for S-based, $Mg_xZn_{1-x}S_ySe_{1-y}$ ($0 \leq x \leq 1$, $0 \leq y \leq 1$), systems of the prior art and Be-based systems, $Be_xMg_yZn_{1-x-y}Se$ ($0 \leq x \leq 1$, $0 \leq y \leq 1$), in accordance with the present invention. In both systems, the guide and cladding layers can be grown lattice-matched to the GaAs substrate. Although the S-based system theoretically has a higher upper limit on bandgap, lateral composition modulation limits the useful bandgap to roughly 3.0 eV. Thus, because of the improved lateral consistency of the invention, the Be-based quaternary can effectively span the same bandgap range. In FIG. 2, all possible bandgap-lattice constant pairs lie within the diamond-shaped region for S-containing quaternaries and in the triangle-shaped region for Be-containing quaternaries. To remain lattice-matched to GaAs, however, the composition must remain on the vertical line shown in FIG. 2. The resulting bandgap ranges for Be and S systems are also shown in FIG. 2. Cladding and guiding layer compositions for 515 nm lasers are also shown in FIG. 2.

The laser structure shown in FIG. 1 includes Be-containing ternary guide layers 14, 16 and quaternary cladding layers 20, 22, and a BeTe/ZnSe digitally graded p-type contact 34. The quaternaries (cladding layers 20 and 22) were grown to a thickness of 1 μm each; the guide layers 14, 16 to a thickness of 0.13 μm each. The n-type and p-type quaternary layers 20 and 22 were doped to a concentration of $2 \times 10^{18}$ cm$^{-3}$ and $2 \times 10^{17}$ cm$^{-3}$, respectively. The bandgaps of the quaternary cladding layers 20 and 22 were 2.84 eV. The bandgaps of the ternary guide layers 14 and 16 were 2.75 eV. The X-ray peaks for the quaternary and ternary were −60 arcsec and +100 arcsec, respectively. The thickness of quantum well 18 was calculated to be 55 Å, based on growth rate, with a Cd composition of about 25% (i.e., $Cd_{0.25}Zn_{0.75}Se$)

Figure 3:
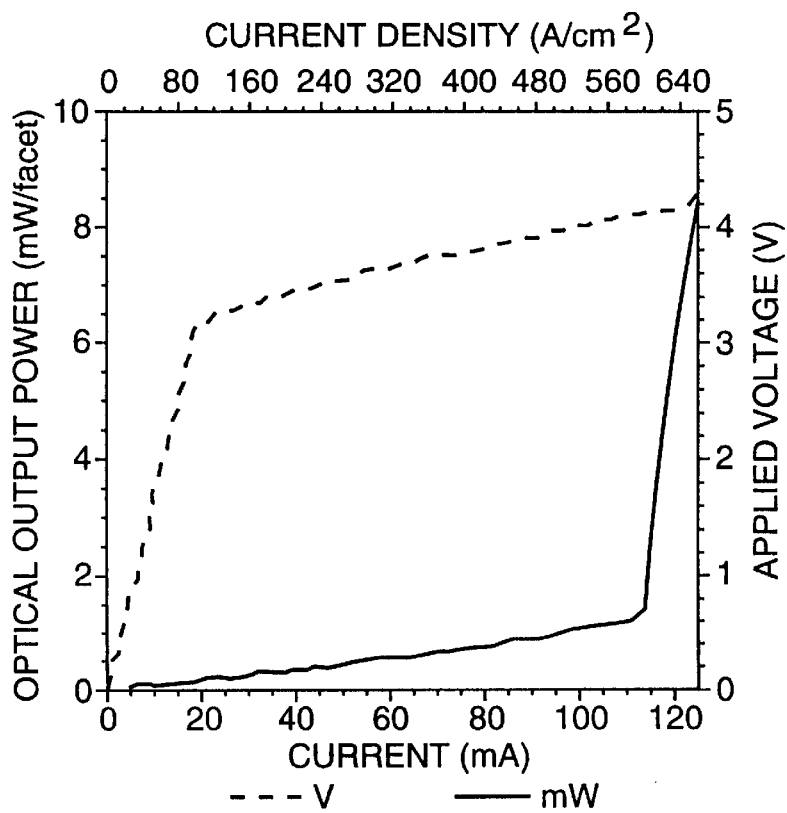
FIG. 3 is a plot of luminescent-current-voltage of the device shown in FIG. 1.

Typical devices fabricated from this sample exhibited threshold current densities of 530 A/cm² with voltages (at 500 A/cm²) of 4.5 V (the lowest being 3.8 V). A plot of optical power and voltage as functions of current in a typical gain-guided device of the invention is shown in FIG. 3. CW laser wavelength is 511 nm.

Figure 4:
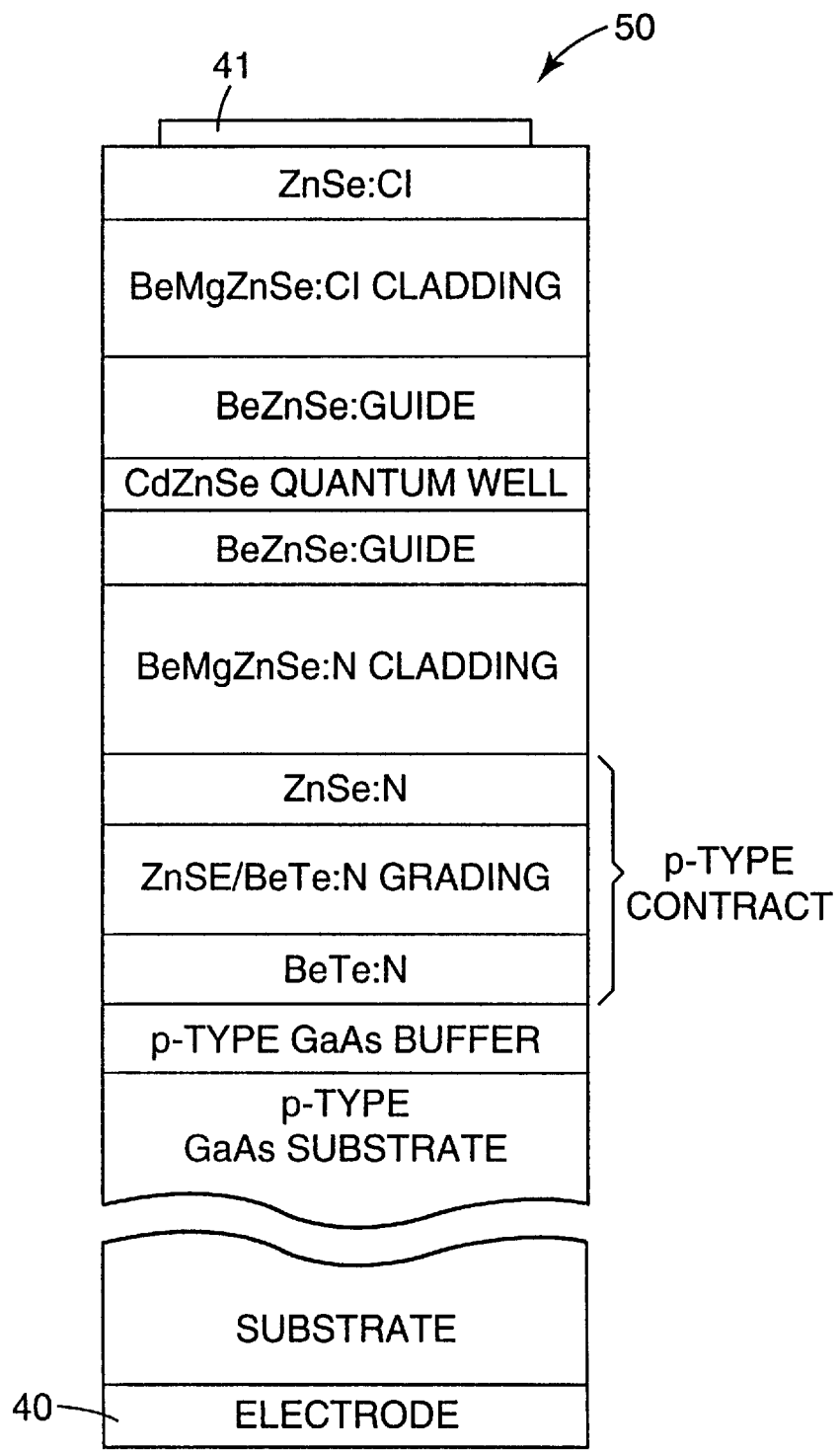
FIG. 4 is a cross-sectional view (not to scale) illustrating the structure of a II–VI semiconductor laser diode having n-type contact up in accordance with another embodiment of the present invention.

FIG. 4 shows laser diode 50 in accordance with another embodiment in which the n-type contact is "up." In other words, the substrate is p-type. Laser diode 50 is similar to laser diode 10 of FIG. 1 except that the conductivity type (p or n) of the layers has been reversed. Diode 50 includes Be in accordance with the invention as described above.

Variations in the specific embodiment described herein are considered within the scope of the present invention. For example, the laser may include either a p-type or n-type substrate. In the case of a p-type substrate, a graded ZnSe—BeTe contact may be used to facilitate hole transport between the substrate and the II–VI layers. Alternative substrate materials include GaAs, GaP or ZnSe. Alternative alloys that may be used for guiding or cladding layers include BeCdTe or BeMgTe which may be grown lattice matched to either GaAs or ZnSe substrates. The active layer, preferably a quantum well or multiple quantum wells, may include alternative II–VI semiconductors such as CdZnSSe, ZnSe, BeCdSe or BeCdZnSe.

DETAILS OF MBE GROWTH

The molecular beam epitaxy (MBE) system used in one embodiment consists of two MBE chambers connected by an ultra high vacuum transfer (UHV) tube. Each chamber can be isolated from the rest of the system by a gate valve. The first chamber is equipped with at least Ga, Si, and Be Knudsen effusion cells, a valved cracker cell for As, and a substrate heater. It is further equipped with a reflection high-energy electron diffraction (RHEED) system for surface characterization during growth. The substrate temperature is measured by two different means depending on the temperature itself. For temperatures above 500° C., the measurement is made with an optical pyrometer. For temperatures below 500° C., temperature is measured indirectly by measuring the GaAs band-gap absorption-edge of infrared radiation from the substrate heater. Temperature is then obtained by comparing the measured absorption-edge energy to bandgap vs. temperature data for GaAs.

The second MBE chamber is equipped with Knudsen effusion cells for Mg, Zn, Be, Te, Cd, and $ZnCl_2$, a valved cracker cell for Se, an RF plasma source for N (supplied by Oxford Applied Research Cambridge, England), and a substrate heater. This chamber is also equipped with a RHEED system. Substrate temperatures are measured with the absorption-edge measurement described above.

For the growth of the n-type-down structure 10 of FIG. 1, Si-doped (001) GaAs substrate 12 is situated on a substrate heater in the first MBE chamber. In preparation for growth, substrate 12 is heated to a temperature of approximately 580° C. in an overpressure of As in order to desorb the native oxide from the surface. After the oxide is removed from the surface, as evident from the RHEED pattern, substrate 12 is further heated to approximately 630° C. to fully outgas the wafer and wafer holder, and to ensure complete oxide removal.

After several minutes substrate 12 is cooled to 580° C. and, when the temperature has stabilized, Si-doped GaAs buffer layer 28 is grown. Growth of buffer layer 28 is initiated by opening the Ga and Si shutters simultaneously (the As valve and shutter are already open). Buffer layer 28 is grown at a rate of 1 μm/hr to a thickness of approximately 0.2 μm. The RHEED pattern during growth is (2×4); indicative of an As-rich surface.

C After growth of buffer 28, growth is terminated by shutting the Ga and Si shutters simultaneously, while leaving the As valve and shutter open. The surface is allowed to anneal at the growth temperature under an As flux for 2 to 10 minutes or longer. At the end of the annealing period, substrate temperature is ramped down from 580° C. to approximately 300° C. in preparation for transfer out of the first MBE chamber to the second MBE chamber. When substrate temperature reaches approximately 550° C., the As valve is closed which causes the surface reconstruction to momentarily change from As-stabilized (2×4) to Ga-stabilized (3×1). Substrate temperature is still ramping down at this time, and when the temperature is in the range of 500° to 520° C., the temperature ramp is stopped momentarily while the surface recovers its As-stabilized (2×4) reconstruction in the absence of an As flux from the As source. When the (2×4) surface has fully recovered (after several minutes), the substrate temperature ramp-down is recommenced. The RHEED pattern during the remainder of the ramp-down is that of an As-stabilized (2×4) surface.

When the sample has cooled to approximately 300° C., it is ready to be transferred to the second MBE chamber for the growth of the II–VI layers. It may be advantageous to transfer at a higher temperature so that the probability of condensing contaminants on the surface is reduced. However, it is a limitation of the system used that the sample be cooled before transfer.

Upon transferring the sample into the second MBE chamber, the sample is situated on the substrate heater and immediately heated to a temperature suitable for growth of the first II–VI layer 24 (ZnSe:Cl). During this time, the sample and heater are facing away from the hot sources to decrease line-of-sight contamination. When the sample temperature has stabilized at the growth temperature of the first layer (200° C.), the sample is rotated up to face the sources. The RHEED pattern is checked to ensure the surface is still As-stabilized (2×4). The first layer 24 growth commences with a Zn-exposure of the surface. Within 10 to 20 seconds the surface reconstruction changes from (2×4) to (1×4), indicative of a complete Zn treatment. The time required for this full transformation is noted, and the Zn treatment is continued for an additional amount of time equal to twice the transformation time. The Zn shutter is then closed and the substrate is heated to 250° C. When the temperature is stable, ZnSe:Cl growth by migration enhanced epitaxy (MEE) is started. After 25 cycles of MEE ZnSe:Cl growth, the sample is further heated to approximately 300° C. for the completion of growth of ZnSe:Cl buffer layer 24 by conventional MBE. The total thickness of ZnSe:Cl layer 24 is approximately 500 Å.

After the ZnSe:Cl buffer 24 growth, growth of lower cladding 20 is started, without pause, by opening the Mg and Be shutters. Layer 20 is grown at a growth rate of approximately 1 $\mu$m/hr to a thickness of 1 $\mu$m. The composition of $Be_xMg_yZn_{1-x-y}Se$ layer 20 is approximately x=0.075 y=0.12, which gives a room temperature bandgap energy of about 2.85 eV and is nominally lattice-matched (pseudomorphic) to GaAs substrate 12. Layer 20 is doped to an n-type concentration of approximately $2\times10^{18}/cm^3$. In other embodiments the bandgap of BeMgZnSe cladding layer 20 may be 2.75 eV or greater. To provide good optical and carrier confinement, the bandgap of cladding layers 20, 22 should be at least 50 meV larger than the bandgap of the guiding layers 14, 16, and preferably at least 100 meV larger than the bandgap of guiding layers 14, 16.

After lower cladding layer 20 is grown, growth is interrupted (by closing the Be, Mg, Zn, and Se shutters, and by closing the Se valve). The Be cell temperature is lowered for growth of $Be_xZn_{1-x}Se$ waveguiding layer 14. Composition of layer 14 is x=0.03, which is lattice-matched to GaAs substrate 12. When the Be cell temperature has stabilized, growth of bottom guide layer 14 is started by first opening the Se valve, then opening the Be, Zn and Se shutters. The growth rate of layer 14 is approximately 0.9 $\mu$m/hr, and the layer is grown to a thickness of about 0.15 $\mu$m. After layer 14 is grown, CdZnSe quantum well 18 is grown, without pausing, by simultaneously closing the Be shutter and opening the Cd shutter. The Cd composition of layer 18 is approximately 25%, and the thickness is about 50 Å, which together produce an emission wavelength of 515 nm. In other embodiments, by adjusting the Cd composition and the quantum well width, the emission wavelength may be selected in the range of 550 to 465 nm. To provide good carrier confinement during room temperature operation, the active layer (typically a quantum well) optical transition energy should be at least 200 meV less than the guiding layer bandgap, and preferably at least 300 meV less than the guiding layer bandgap.

After quantum well 18 is grown, top waveguide 16 growth begins without interruption by simultaneously closing the Cd shutter and opening the Be shutter. Top waveguide 16 is grown to a thickness of 0.15 $\mu$m. Both top and bottom waveguides 14, 16 are undoped.

Prior to the growth of top cladding layer 22 (same composition and thickness as bottom cladding layer 20), the growth is interrupted to raise the Be cell temperature and to start the N plasma. As soon as the temperature has stabilized, growth of top cladding layer 22 commences by opening the Se valve, and then simultaneously opening the Mg, Be, Zn, Se, and N shutters. The doping in layer 22 ($N_A-N_D$) is approximately $2\times10^{17}cm^{-3}$.

In one embodiment, an etch stop layer is included to improve the subsequent fabrication of index-guided lasers through the use of selective etching. This method is described in co-pending application entitled SELECTIVE ETCH FOR II–VI SEMICONDUCTORS, filed on even date herewith. Typically, the first 500 Å of the BeMgZnSe cladding layer is grown and then an etch-stop layer—typically ZnSe or BeZnSe, 200 Å thick—is grown on top of it. The remainder of the BeMgZnSe cladding layer is then grown.

After top cladding layer 22 is grown, top p-type contact 34 is grown. Contact growth starts with a 1000 Å layer 26 of ZnSe:N followed by a digitally graded layer 36 of alternating BeTe:N and ZnSe. In this graded region only the BeTe layers are doped with N; during growth of the ZnSe layers the N is shuttered off. Digitally graded layer 36 consists of 16 BeTe/ZnSe layer pairs which are 20 to 23 Å thick. The first BeTe layer of the first pair is 1–2 Å thick (the remaining 20 to 23 Å being ZnSe) and the thickness of the BeTe layers increase approximately linearly over the remaining pairs. Likewise, the ZnSe layer thicknesses decrease approximately linearly; the last one being 1–2 Å thick. After digitally graded layer 36 is grown, a 500 Å layer 38 of BeTe:N is grown. There is no growth interruption between any of the p-type contact layers.

A p-type-contact-down structure may also be grown as shown in FIG. 4. In this case, a p-type GaAs substrate is used. A Be-doped GaAs buffer layer is grown first, according to the growth procedure described above.

Upon transfer of the p-type buffer into the second chamber, the sample is situated on the substrate heater and immediately heated to a temperature suitable for growth of the first II–VI layer. The first layer grown is undoped ZnSe grown by MEE in the same manner as noted above, starting with a Zn-treatment of the GaAs surface at 200° C. In this case, however, the layer is only 4 or 5 monolayers thick. After this layer is grown, a 500 Å layer of BeTe:N is grown followed immediately by a digitally graded p-type contact layer of BeTe:N/ZnSe. The digitally graded layer is followed by 1000 Å of ZnSe:N. This p-type contact structure is the same as for the n-type-down structure, but with the layer growth sequence reversed. In other embodiments, the first layer grown on the GaAs buffer is the 500 Å BeTe:N layer with or without a first Zn treatment of the GaAs surface.

After the p-type contact structure is grown, the cladding layers, waveguide and quantum well are grown at the same temperatures and compositions and timing as the n-type down structure, but with the order of the layers reversed. After the top n-type cladding layer is grown, 1000 Å of ZnSe:Cl is grown to aid in making electrical contact. In addition, the Cl doping in this layer is ramped up from approximately $2 \times 10^{18}/cm^3$ to above $10^{19}/cm^3$.

DESIGN GUIDELINES

To efficiently provide even shorter wavelength operation (less than 500 nm) it is necessary to increase the bandgap energies of both guiding layers 14, 16 and cladding layers 20, 22 of device 10. This is accomplished by using two different compositions of BeMgZnSe for guiding layers 14, 16 and cladding layers 20, 22. Good optical confinement can be achieved if the bandgap of cladding layers 20, 22 is 100 meV or more larger than the bandgap of guiding layers 14, 16. In this design, active layer 18 may be, for example, CdZnSe, ZnSe, BeCdSe, BeMgZnSe, or BeZnCdSe. Active layer 18 optical transition energy should be at least 200 meV Less than the bandgap energy of guiding layers 20, 22, and preferably at least 300 meV less than that of guiding layers 20, 22.

The appropriate thicknesses of the cladding and guiding layers are determined primarily by the difference in refractive index of the layers, which is related to the bandgaps. If the bandgap of the guiding layers is 100 meV less than that of the cladding layers, the total thickness of the two guiding layers should be between 0.1 μm and 1.0 μm, preferably about 0.3 μm. To minimize absorption of the laser light by the substrate and the top electrode, the thickness of cladding layers should each be at least 0.5 μm and preferably at least 1.0 μm.

To provide very short wavelength emission, a GaP substrate may be used. This allows larger bandgaps of BeMgZnSe to be grown lattice-matched to the substrate.

FABRICATION DETAILS

To fabricate laser diodes from these epitaxial layers, ohmic contact to the n-type GaAs substrate 12 is made by etching the lower surface of GaAs substrate 12 for a short period of time (e.g., 2 minutes) to remove several micrometers from the back side of substrate 12. Conventional GaAs etchants (e.g., 5 $H_2O$-1 $H_2O_2$-1 $NH_4OH$) can be used for this purpose. Five nm of Pd, 25 nm of Ge, and 200 nm of Au are sequentially evaporated on the etched lower surface of the substrate. The wafer including the Pd, Ge, and Au layers is then annealed in nitrogen or forming gas for about 2 minutes at 180° C. In other embodiments, the substrate surface is lapped to a thickness of approximately 150 μm and polished smooth before it is etched.

Gain-guided laser diode devices are fabricated from the epitaxially grown structure by first providing a metal contact to p-type semiconductor contact 34. Five (5) nm of palladium and 50 nm of gold and 1 nm of Ti (the Ti improves photoresist adhesion) are sequentially vacuum evaporated on the surface of the II–VI contact layer. Standard microelectronic lithography is then performed to define 20 μm wide lines on the surface of the deposited metal. Contact 34 and the above metal layers outside the 20 μm line region are then removed with Xe+ ion-milling. 2500 Å of ZnS is then thermally evaporated onto the surface. This deposited polycrystalline ZnS is an insulator. The ZnS deposited on top of the 20 μm photoresist lines is then removed along with the photoresist with acetone or any appropriate photoresist solvent. Finally, metal electrodes (typically 100 nm Ti, 200 nm Au) are evaporated onto the surface. These electrodes are typically formed into 200 μm wide stripes, centered on the 20 μm lines. Laser cavities are formed using cleaved-facet mirrors.

In another embodiment, buried-ridge index-guided lasers are fabricated using techniques based on those described in BURIED RIDGE II–VI LASER DIODE U.S. Pat. No. 5,404,027 and co-pending application entitled SELECTIVE ETCH FOR II–VI SEMICONDUCTORS, filed on even date herewith. The process begins by first vacuum evaporating 5 nm Pd, 50 nm Au and 1 nm Ti on the II–VI contact layer. Using standard techniques, 4 μm wide photoresist stripes are defined. Xe+ ion etching is used to etch through the metals, and partially through the top BeMgZnSe cladding layer. Then the sample is etched in concentrated HCl solution. The HCl solution will etch BeMgZnSe cladding layers much faster than the BeZnSe guiding layers, so the etching selectively stops at the top of the guiding layers. Optionally, an additional etch-stop layer of may be grown within the top BeMgZnSe cladding layer, typically 50 nm above the guiding layer. In this case, after the selective HCl etch, 50 nm of BeMgZnSe and the etch stop layer itself remain. This embodiment provides finer control the optical mode and also minimizes surface recombination during operation of the device. The etch-stop layer itself may be any II–VI material that etches significantly slower than the BeMgZnSe cladding layer, such as ZnSe, BeZnSe, or BeMgZnSe which contains less Mg than the cladding layer. As an alternative to HCl, HBr solution may be used to provide slower selective etching.

After the selective etching, polycrystalline ZnS is vacuum evaporated onto the sample. The thickness of the ZnS is sufficient to fill in regions where the cladding was etched away. The ZnS deposited on top of the 4 μm photoresist lines is then removed along with the photoresist using acetone or any appropriate photoresist solvent and ultrasound. Final metal electrodes (typically 100 nm Ti, 200 nm Au) are then evaporated onto the surface. These electrodes are typically formed into 200 μm wide stripes, centered on the 4 μm buried ridges. Laser cavities are formed using cleaved-facet mirrors.

Removal of heat from the device is provided by soldering the fabricated laser diode to a heat sink, typically using indium solder. The laser may be mounted with either the substrate electrode or the top (epitaxy-side) electrode soldered to the heat sink.

Although the present invention has been described with reference to preferred embodiments, workers skilled in the art will recognize that changes may be made in form and detail without departing from the spirit and scope of the invention. Be-containing II–VI semiconductor diodes of the invention can find use in electronic devices, electronic systems, optical data storage systems, communications systems, electronic display systems, laser pointers, etc.

What is claimed is:

1. A II–VI compound semiconductor laser diode, including:

a first cladding layer of II–VI semiconductor including Be of n-type conductivity;

a first guiding layer of II–VI semiconductor overlaying the first cladding layer;

an active layer of II–VI semiconductor overlaying the first guiding layer;

a second guiding layer of II–VI semiconductor overlaying the active layer;

a second cladding layer of II–VI semiconductor including Be of p-type conductivity overlaying the second guiding layer; and a p-type ohmic contact electrically coupled to the second cladding layer, the ohmic contact including Be;

wherein the active layer has an optical transition energy of at least about 200 meV less than a bandgap energy of the guiding layers and the cladding layers have a bandgap energy at least 50 meV greater than the bandgap energy of the guiding layers sufficient to provide a difference in refractive indices between the cladding layers and guiding layers suitable for optical confinement.

2. The II–VI compound semiconductor laser diode of claim 1 wherein the first cladding layer comprises $Be_xMg_yZn_{1-x-y}Se$, where $0 \leq x \leq 1$.

3. The II–VI compound semiconductor laser diode of claim 1 wherein the second cladding layer comprises $Be_xMg_yZn_{1-x-y}Se$, where $0 \leq x \leq 1$.

4. The II–VI compound semiconductor laser diode of claim 2 or claim 3 wherein x is about 0.075 and y is about 0.12.

5. The II–VI compound semiconductor laser diode of claim 2 wherein the bandgap of the first cladding layer is greater than about 2.75 eV.

6. The II–VI compound semiconductor laser diode of claim 1 wherein the first guiding layer comprises $Be_xZn_{1-x}Se$ ($0 \leq x \leq 1$).

7. The II–VI compound semiconductor laser diode of claim 1 wherein the second guiding -layer comprises $Be_xZn_{1-x}Se$ ($0 \leq x \leq 1$).

8. The II–VI compound semiconductor laser diode of claim 6 or claim 7 wherein x is about 0.03.

9. The II–VI compound semiconductor laser diode of claim 1 including a single crystal semiconductor substrate and wherein the cladding layers and guiding layers are lattice matched to a lattice constant of the single crystal semiconductor substrate.

10. The II–VI compound semiconductor laser diode of claim 9 wherein the substrate comprises GaAs.

11. The II–VI compound semiconductor laser diode of claim 9 wherein the substrate comprises ZnSe.

12. The II–VI compound semiconductor laser diode of claim 9 wherein the substrate comprises GaP.

13. The II–VI compound semiconductor laser diode of claim 1 wherein the active layer includes Cd and a concentration of Cd and a thickness of the active layer is selected to provide light emission of between about 550 nm and about 465 nm.

14. The II–VI compound semiconductor laser diode of claim 1 wherein the active layer is selected from the group consisting of CdZnSe, ZnSe, BeCdSe, BeMgZnSe, or BeZnCdSe.

15. The II–VI compound semiconductor laser diode of claim 1 wherein the guiding layers have a combined thickness of between 0.1 $\mu$m and 1.0 $\mu$m.

16. The II–VI compound semiconductor laser diode of claim 1 includes a single crystal substrate.

17. The II–VI compound semiconductor laser diode of claim 1 wherein the active layer comprises a quantum well active layer.

18. The II–VI compound semiconductor laser diode of claim 1 wherein the active layer comprises a multiple quantum well active layer.

19. An optical data storage system including a II–VI compound semiconductor laser diode in accordance with claim 1.

20. An electronic display system including a II–VI compound semiconductor laser diode in accordance with claim 1.

21. A laser pointer including a II–VI compound semiconductor laser diode in accordance with claim 1.

22. The II–VI compound semiconductor laser diode of claim 1 wherein the ohmic contact includes a grading layer containing Be therein.

* * * * *

UNITED STATES PATENT AND TRADEMARK OFFICE
CERTIFICATE OF CORRECTION

PATENT NO. : 5,818,859
DATED : October 6, 1998
INVENTOR(S) : Thomas J. Miller, Michael A. Haase, Paul F. Baude, and Michael D. Pashley It is certified that error appears in the above-identified patent and that said Letters Patent is hereby corrected as shown below:

Title page, item [73] after "Minn." insert --Philips Electronics North America Corporation, New York, New York --.

Col. 4, line 66, "C After" should read -- After --.

Col. 7, line 33, "Less" should read -- less --.

Col. 9, In claim 2, "$0 \leq x \leq 1$" should read -- $0 < x \leq 1$ --.

Col. 9, In claim 3, "$0 \leq x \leq 1$" should read -- $0 < x \leq 1$ --.

Col. 9, In claim 6, "$0 \leq x \leq 1$" should read -- $0 < x \leq 1$ --.

Col. 9, In claim 7, "-layer" should read -- layer --.

Col. 9, In claim 7, "$0 \leq x \leq 1$" should read -- $0 < x \leq 1$ --.

Signed and Sealed this

Twenty-sixth Day of September, 2000

Attest:

Q. TODD DICKINSON

*Attesting Officer*    *Director of Patents and Trademarks*